(12) United States Patent
Tsai et al.

(10) Patent No.: US 10,673,104 B2
(45) Date of Patent: Jun. 2, 2020

(54) METHOD FOR TESTING SEMI-FINISHED BATTERY CELL

(71) Applicant: CHROMA ATE INC., Taoyuan (TW)

(72) Inventors: Chih-Ming Tsai, Taoyuan (TW);
Chao-Hsu Chen, Taoyuan (TW);
Han-Chou Liao, Taoyuan (TW);
Chung-Yu Siang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 334 days.

(21) Appl. No.: 15/912,222

(22) Filed: Mar. 5, 2018

(65) Prior Publication Data

US 2018/0323481 A1 Nov. 8, 2018

(30) Foreign Application Priority Data

May 5, 2017 (TW) .............................. 106115067 A

(51) Int. Cl.
*H02J 7/00* (2006.01)
*H01M 10/48* (2006.01)
*H01M 10/44* (2006.01)
*H01M 10/42* (2006.01)
*G01R 19/165* (2006.01)

(52) U.S. Cl.
CPC ...... *H01M 10/48* (2013.01); *G01R 19/16542* (2013.01); *H01M 10/425* (2013.01); *H01M 10/44* (2013.01); *H01M 2010/4271* (2013.01)

(58) Field of Classification Search
CPC .................................................... H01M 10/48
USPC .......................................................... 320/132
See application file for complete search history.

(56) References Cited

U.S. PATENT DOCUMENTS

| | | | | |
|---|---|---|---|---|
| 7,528,574 B1* | 5/2009 | Adkins | ................. | H01M 10/44 320/128 |
| 2002/0141261 A1* | 10/2002 | Yamasaki | .............. | G11C 5/145 365/201 |
| 2005/0007075 A1* | 1/2005 | Woo | ..................... | H02J 7/0071 320/148 |
| 2008/0036425 A1* | 2/2008 | Tashiro | ............... | H01M 10/486 320/154 |
| 2011/0266998 A1* | 11/2011 | Xiao | .................... | H02J 7/00711 320/107 |
| 2013/0328566 A1* | 12/2013 | Hojo | .................... | G01R 31/385 324/426 |

* cited by examiner

*Primary Examiner* — Yalkew Fantu
(74) *Attorney, Agent, or Firm* — Maschoff Brennan

(57) ABSTRACT

A method is provided for testing a semi-finished battery cell. The semi-finished battery cell is charged with a constant current when a voltage difference between the first conductor and the second conductor is less than a voltage threshold. The semi-finished battery cell is charged with a constant voltage when the voltage difference between the first conductor and the second conductor is equal to or larger than the voltage threshold. An overall electric quantity is obtained after a default time period, wherein the overall electric quantity is an electric quantity charged to the semi-finished battery cell with the constant current during the default time period. Accordingly, an insulation related to electrodes of the semi-finished battery cell is determined as poor when the overall electric quantity is larger than an electric quantity threshold.

8 Claims, 7 Drawing Sheets

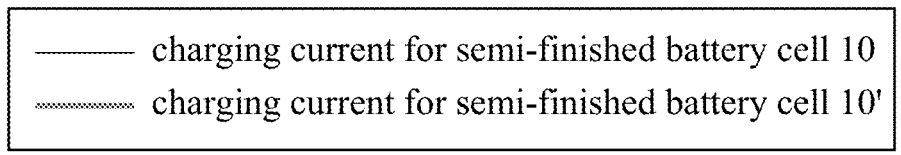

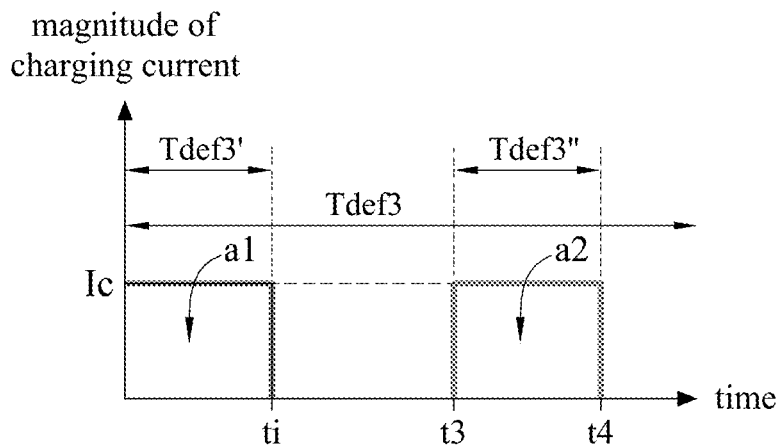

FIG. 4C

```
┌─────────────────────────────────────────────────┐
│ measuring a plurality of current charging time   │
│ periods in which the semi-finished battery cell  │──S201
│ is charged with the constant current             │
└─────────────────────────────────────────────────┘
                      ↓
┌─────────────────────────────────────────────────┐
│ obtaining a plurality of current charging        │
│ electric quantities according to the constant    │──S203
│ current and the plurality of current             │
│ charging time periods                            │
└─────────────────────────────────────────────────┘
                      ↓
┌─────────────────────────────────────────────────┐
│ determining whether each of the current charging │
│ quantities is larger than a respective one of a  │
│ plurality of electric quantity thresholds,       │
│ wherein an insulation between the first          │
│ electrode and the second electrode of the        │──S205
│ semi-finished battery cell is determined as poor │
│ when one of the current electric charging        │
│ quantities is larger than the corresponding      │
│ electric quantity threshold                      │
└─────────────────────────────────────────────────┘
```

FIG. 5

METHOD FOR TESTING SEMI-FINISHED BATTERY CELL

CROSS-REFERENCE TO RELATED APPLICATIONS

This non-provisional application claims priority under 35 U.S.C. § 119(a) on Patent Application No(s). 106115067 filed in Taiwan, R.O.C. on May 5, 2017, the entire contents of which are hereby incorporated by reference.

TECHNICAL FIELD

This disclosure is related to a method for testing a semi-finished battery cell, particularly to a method for testing and measuring the insulation of the semi-finished battery cell.

BACKGROUND

Electronic industry is flourishing and various kinds of electronic product are quite popular. The narrowing-down in size and the lightening on weights is the most important for the manufacture of portable electronic product. For the convenience in portation, batteries have become a usual electricity storage component. Thus, power can be supplied for electronic product anywhere.

Most of the current portable electronic devices adapt reusable lithium-ion battery which has large battery capacity and large energy density. A semi-finished battery of a lithium-ion battery has a plurality of anode electrodes, a plurality of cathode electrodes and insulation films which are in a pile. Electrolyte is finally filled into the semi-finished battery to complete the lithium-ion battery. In such a structure, the distance between the anode and the cathode of the semi-finished battery matters a lot. By the current practice, the anode and the cathode of hoe semi-finished battery are separated by said insulation film; namely, the insulation film made said distance between the anode and the cathode. However, in the corresponding process, said distance may be shrunk due to the cut burrs, unexpected particles or unevenly material thickness, inducing the unwanted short circuit between the anode and the cathode.

Though an insulation test is usually performed during the process, the main test item by now is hi-pot test and tends to cause misjudgement of device under test (DUT) due to long energy transition time and considerable capacitor deviation (about ±20%). Besides, there's only a little difference between the scales of the steady state and the non-stead state of the semi-finished battery cell, thus an accurate determination may not be achieved.

SUMMARY

According to another embodiment, a method for testing semi-finished battery cell adapted for a semi-finished battery cell is provided. The semi-finished battery cell includes a first electrode and a second electrode, with said first and second electrodes disposed in a pile, with an insulation layer disposed between the first electrode and the second electrode, with the first electrode electrically connected to a first conductor, and with the second electrode electrically connected to a second conductor. In the method, the following steps are performed: charging the semi-finished battery cell with a constant current when a voltage difference between the first conductor and the second conductor is less than a voltage threshold; charging the semi-finished battery cell with a constant voltage when the voltage difference between the first conductor and the second conductor is equal to or larger than the voltage threshold; obtaining an overall electric quantity after a default time period, wherein the overall electric quantity is an electric quantity charged to the semi-finished battery cell with the constant current during the default time period; and determining whether the overall electric quantity is larger than an electric quantity threshold, wherein an insulation between the first electrode and the second electrode of the semi-finished battery cell is determined as poor when the overall electric quantity is larger than the electric quantity threshold.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein:

FIG. 4C is a diagram related to charging a semi-finished battery cell with the constant current in the embodiment shown in FIG. 2C of this disclosure.

FIG. 5 is a flow chart of a part of a test method for a semi-finished battery cell in another embodiment of this disclosure.

DETAILED DESCRIPTION

Figure 1A:
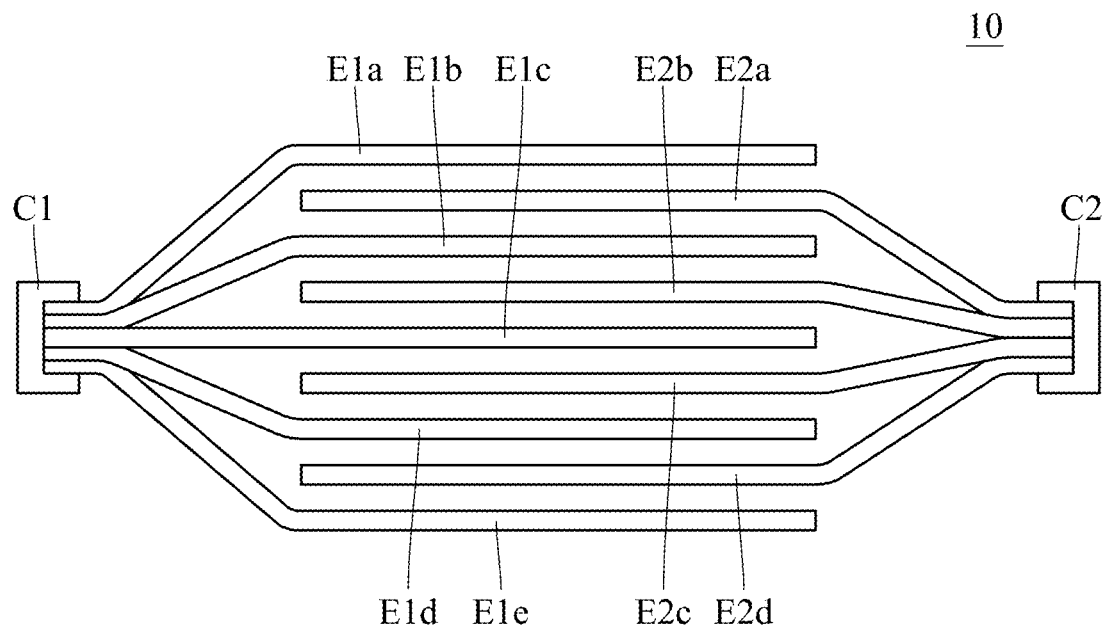
FIG. 1A is a structure diagram of an ideal semi-finished battery cell in one embodiment of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

This disclosure provides a method for testing a semi-finished battery cell. The test method is adapted for a semi-finished battery cell. Please refer to FIG. 1A. FIG. 1A is a structure diagram of an ideal semi-finished battery cell 10 in one embodiment of this disclosure. A semi-finished battery cell 10 includes a first electrode and a second electrode. In the embodiment, first electrodes E1a, E1b, E1c, E1d and E1e and second electrode E2a, E2b, E2c and E2d are exemplified, but the numbers of the first electrode and the second electrode are not limited thereto. In practice, there is an insulation layer disposed between one of the first electrodes and one of the second electrodes to separate the first electrode and the second electrode. The insulation layer is not specifically addressed and does not affect the clarity for understanding.

The first electrodes E1a, E1b, E1c, E1d and E1e of the semi-finished battery cell 10 are connected to the first conductor C1. The second electrodes E2a, E2b, E2c and E2d of the semi-finished battery cell 10 are connected to the second conductor C2. In practice, the first conductor C1 and the second conductor C2 are made of one or more conductive materials. The first conductor C1 and the second conductor C2 are respectively connected to the first electrodes and the second electrodes by, for example, clamping, welding or other way alike. In other words, the first electrodes E1a, E1b, E1c, E1d and E1e are electrically connected to each other through the first conductor C1, and the second electrodes E2a, E2b, E2c and E2d are electrically connected to each other through the second conductor C2. The first electrodes E1a, E1b, E1c, E1d and E1e are one of the anode and cathode of the battery while the second electrodes E2a, E2b, E2c and E2d are the other of them.

Figure 1B:
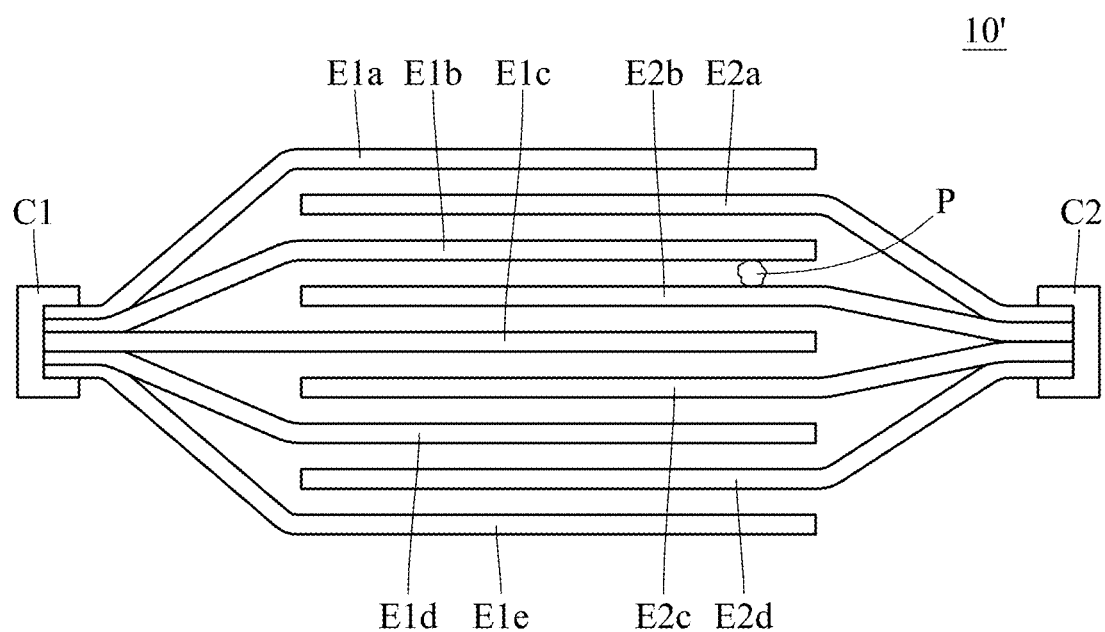
FIG. 1B is a structure diagram of a semi-finished battery cell with a defect in one embodiment of this disclosure.

Ideally, the structure of the semi-finished battery cell should be like what FIG. 1A shows, which means that each of the first electrode E1a, E1b, E1c, E1d and E1e does not contact each of the second electrode E2a, E2b, E2c and E2d; namely, there is no short circuit between any of the first electrode E1a, E1b, E1c, E1d and E1e and any of the second electrode E2a, E2b, E2c and E2d. However, practically, a part of the first electrodes can be shorted to a part of the second electrode due to material burrs, unevenly thickness of insulation layers or unexpected particles. Please also refer to FIG. 1B. A possible condition of a non-ideal semi-finished battery cell 10' is illustrated in FIG. 1B, a structure diagram of a semi-finished battery cell with a defect in one embodiment of this disclosure. The structure of said semi-finished battery cell 10' is similar to the structure of the semi-finished battery cell 10. However, in comparison with what is shown in FIG. 1A, there is a particle P in the structure of semi-finished battery cell 10'. The particle P is between the first electrode E1b and the second electrode E2b of the semi-finished battery cell 10'. The particle P contacts both the first electrode E1b and the second electrode E2b, and the first electrode E1b and second electrode E2b are thus in electrically connection through the particle P.

In practice, the particle P may randomly move according to the physical condition when it is in the structure of the semi-finished battery cell 10'. Therefore, the characteristics like the starting time, the duration and the conductivity of said short circuit between the first electrode E1b and the second electrode E2b may vary according to the material, size and the contacting to the electrodes of the particle P. As a result, a particle in the structure of the semi-finished battery cell does not always induce a short circuit and durations of short circuits occurring at different time may not be the same. Under such a circumstance, a test method capable of measuring said internal insulation in the semi-finished battery cell, even quantizing said internal insulation, is urgently and practically needed. Hereinafter, the semi-finished battery cell 10 will be referred to the ideal semi-finished battery cell and the semi-finished battery cell 10' will be referred to the non-ideal semi-finished battery cell for illustration.

Figure 2A:
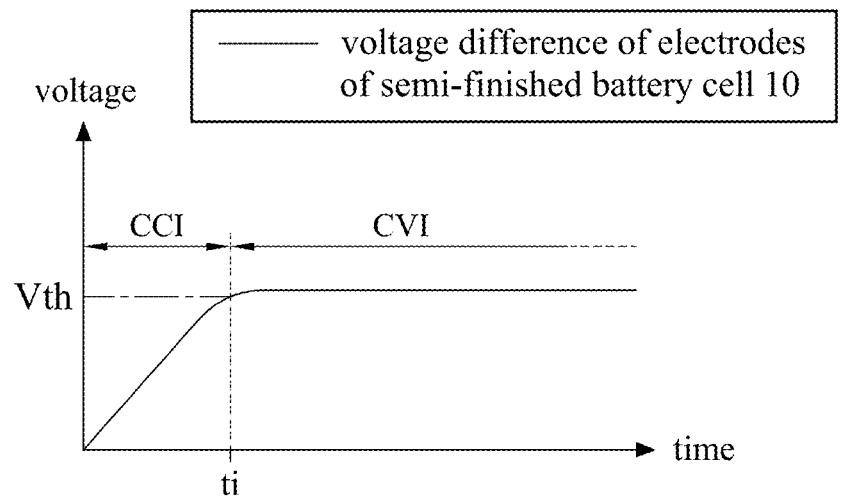
FIG. 2A is a voltage difference diagram related to charging an ideal semi-finished battery cell in one embodiment of this disclosure.

Please refer to FIG. 2A, which is adapted for illustrating a situation about charging the ideal semi-finished battery cell. FIG. 2A is a voltage difference diagram related to charging an ideal semi-finished battery cell in one embodiment of this disclosure. Specifically, FIG. 2A is configured to illustrate the variation in voltage difference between the first conductor C1 and the second conductor C2 when the semi-finished battery cell 10 is charged. The horizontal axis represents time and the vertical axis represents the value of said voltage difference. A constant current charging time period CCI and a constant voltage charging time period CVI are defined in FIG. 2A. Literally, semi-finished battery cell 10 is charged with a constant current in the constant current charging time period CCI and is charged with a constant voltage in the constant voltage charging time period CVI.

In the embodiment shown in FIG. 2A, the semi-finished battery cell 10 is charged with the constant current at first. The semi-finished battery cell 10 is charged with the constant voltage instead when the voltage difference is larger than or equal to a voltage threshold Vth. In this embodiment, the voltage difference of the electrodes of the semi-finished battery cell 10 reaches the voltage threshold at a time instant ti after the charging starts. Therefore, the constant current charging time period CCI is a time period before the time instant ti, and the constant voltage charging time period CVI is another time period after the time instant ti. The time instant ti can be defined as being included in the constant current charging time period CCI or in the constant voltage charging time period CVI. Corresponding to different ways of charging, a first part of the charging curve representing the voltage difference of the electrodes of the semi-finished battery cell 10 in the constant current charging time period CCI is a curve with a constant slope, while a second part of the charging curve representing the voltage difference of the electrodes of the semi-finished battery cell 10 in the constant voltage charging time period CVI is a horizontal line (slope is zero).

Figure 2B:
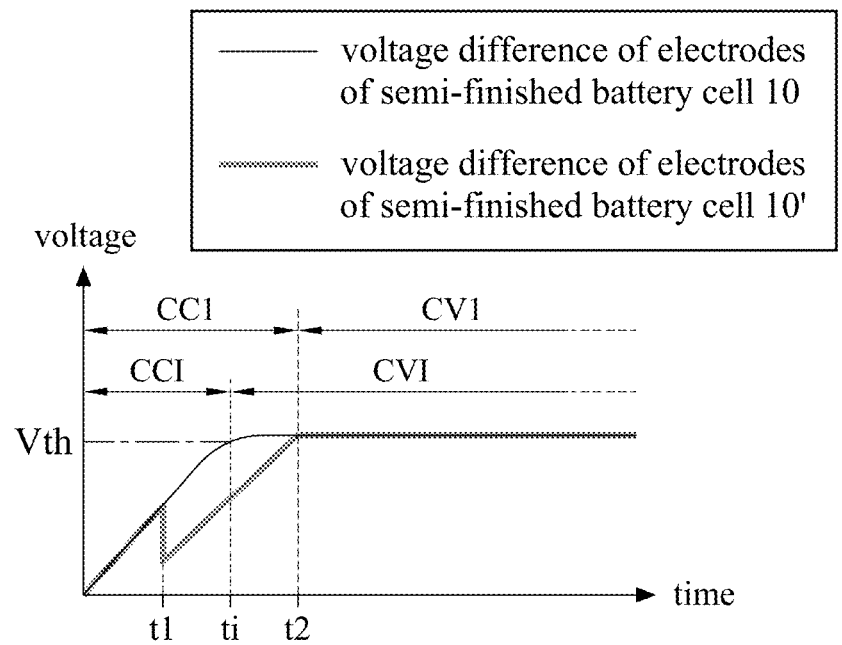
FIG. 2B is a voltage difference diagram related to charging a semi-finished battery cell having a defect in one embodiment of this disclosure.

Please refer to FIG. 2B, which is adapted for illustrating a situation about charging the non-ideal semi-finished battery cell. FIG. 2B is a voltage difference diagram related to charging a semi-finished battery cell having a defect in one embodiment of this disclosure. The charging curves of the ideal situation and the non-ideal situation are both illustrated in FIG. 2B, wherein the curve shown by a bold line represents the voltage difference of the electrodes of the semi-finished battery cell 10' and the curve shown by a thin line represents the voltage difference of the electrodes of the semi-finished battery cell 10 for comparison. The voltage difference of the electrodes of the semi-finished battery cell 10 in FIG. 2B is the same as the voltage difference of the electrodes of the semi-finished battery cell 10 in FIG. 2A. For illustration, corresponding to the voltage difference of the electrodes of semi-finished battery cell 10', a constant current charging time period CC1 and a constant voltage charging time period CV1 are further defined tin FIG. 2B, wherein the constant current charging time period CC1 is a time period before the time instant t2, the constant voltage charging time period CV1 is another time period after the time instant t2 and the time instant t2 can be included in the constant current charging time period CC1 or the constant voltage charging time period CV1.

In the embodiment illustrated in FIG. 2B, the semi-finished battery cell 10' is charged with the constant current at first and a short circuit is occurred at the time instant t1 prior to the time instant ti. As a result, the voltage difference of the electrodes of the semi-finished battery cell 10' increases with the constant voltage increasing rate (corresponding to the constant slope in the figure). However, a part of the electrodes of the semi-finished battery cell 10' may discharge abnormally when charged with the constant current once the short circuit shown in FIG. 1B occurs in the structure of the semi-finished battery cell 10' at time instant t1. Thus, the voltage difference of the electrodes of the semi-finished battery cell drops rapidly around the time instant t1. After the time instant t1, the short circuit no longer exists due to the practical physical condition, the voltage difference of the electrodes of the semi-finished battery cell 10' charged with the constant current re-climbs at the constant voltage increasing rate. At the time instant t2, the voltage difference of the electrodes of the semi-finished battery cell 10' reaches the voltage threshold and a constant voltage is adapted for charging the semi-finished battery cell 10' instead.

Figure 2C:
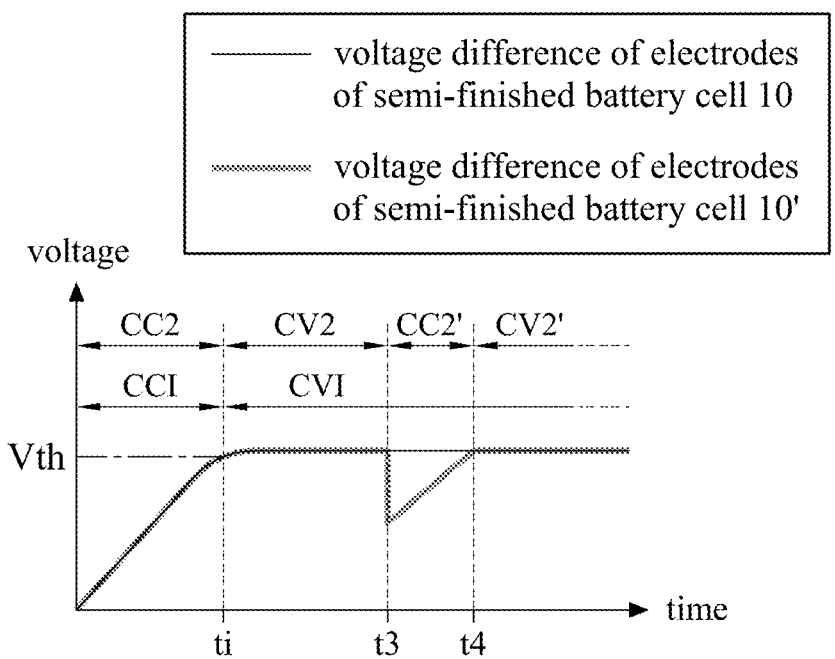
FIG. 2C is a voltage difference diagram related to charging a semi-finished battery cell having a defect in another embodiment of this disclosure.

Please refer to FIG. 2C. Another situation about charging the non-ideal semi-finished battery cell will be illustrated thereby. FIG. 2C is a voltage difference diagram related to charging a semi-finished battery cell having a defect in another embodiment of this disclosure. The charging curves of the ideal and the non-ideal situations are both illustrated in FIG. 2C, wherein the curve shown by a bold line represents the voltage difference of the electrodes of the semi-finished battery cell 10' and the curve shown by a thin line represents the voltage difference of the electrodes of the semi-finished battery cell 10. In FIG. 2C, regarding the charging curve of the voltage difference of the electrodes of the semi-finished battery cell 10', constant current charging time periods CC2, CC2' and constant voltage charging time periods CV2, CV2' are defined, wherein the constant current charging time period CC2 is prior to the constant voltage charging time period CV2, the constant voltage charging time period CV2 is prior to the constant current charging time period CC2', and the constant current charging time period CC2' is prior to the constant voltage charging time period CV2'. In time order, the constant current charging time period CC2 is before the time instant ti, the constant voltage charging time period CV2 is between the time instant t3 and time instant t4 and the constant voltage charging time period CV2' is after the time instant t4.

In the embodiment shown in FIG. 2C, the voltage difference of the electrodes of the semi-finished battery cell 10' reaches voltage threshold Vth at time instant ti. Said short circuit occurs at time instant t3, wherein the time instant t3 is after the time instant ti. The voltage difference drops rapidly at time instant t3. Since the voltage difference of the electrodes of the semi-finished battery cell 10' is less than the voltage threshold Vth once again after the time instant t3, the constant current is adapted to re-charge the semi-finished battery cell 10'. After the time instant t3, the short circuit no longer exists due to the practical physical condition and the voltage difference of the electrodes of the semi-finished battery cell 10' charged with the constant current re-climbs at the constant voltage increasing rate. At time instant t4, the voltage difference of the electrodes of the semi-finished battery cell 10' reaches the voltage threshold Vth once again and then the constant voltage is adapted again for charging the semi-finished battery cell 10'.

Figure 3:
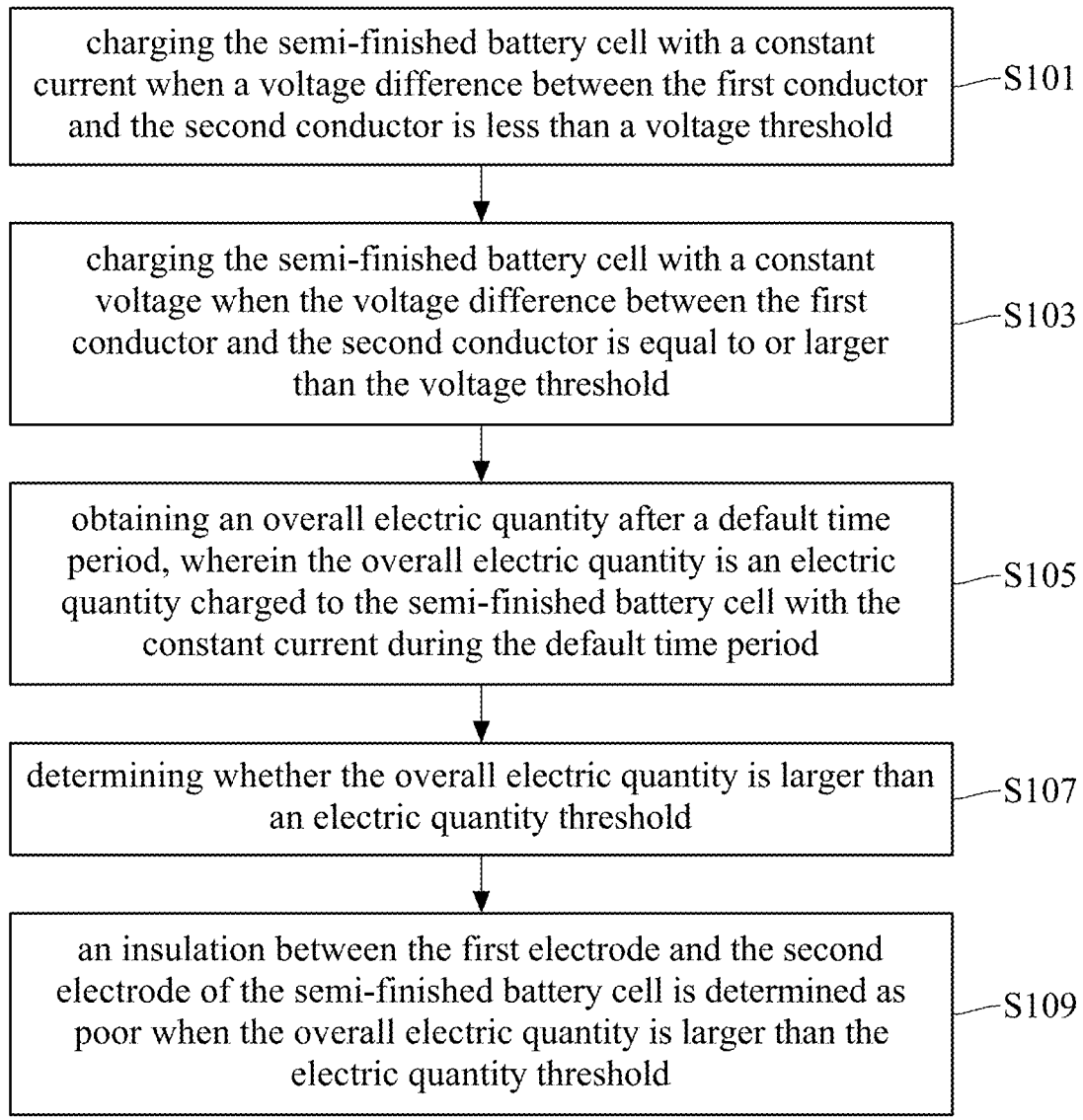
FIG. 3 is a flow chart of a test method for a semi-finished battery cell in one embodiment of this disclosure.

Based on the aforementioned situation, this disclosure provides a method for testing semi-finished battery cell to recognize non-ideal semi-finished battery cells. Please refer to FIG. 3, a flow chart of a test method for a semi-finished battery cell in one embodiment of this disclosure. In this embodiment, the following steps are performed: the step S101, charging the semi-finished battery cell with a constant current when a voltage difference between the first conductor and the second conductor is less than a voltage threshold; the step S103, charging the semi-finished battery cell with a constant voltage when the voltage difference between the first conductor and the second conductor is equal to or larger than the voltage threshold; the step S105, obtaining an overall electric quantity after a default time period, wherein the overall electric quantity is an electric quantity charged to the semi-finished battery cell with the constant current during the default time period; the step S107, determining whether the overall electric quantity is larger than an electric quantity threshold; and the step S109, an insulation between the first electrode and the second electrode of the semi-finished battery cell is determined as poor when the overall electric quantity is larger than the electric quantity threshold. By the test method provided by this disclosure, short circuits at different timing can be recognized and corresponding quantization indices can be determined. Situations are illustrated in the following.

Figure 4A:
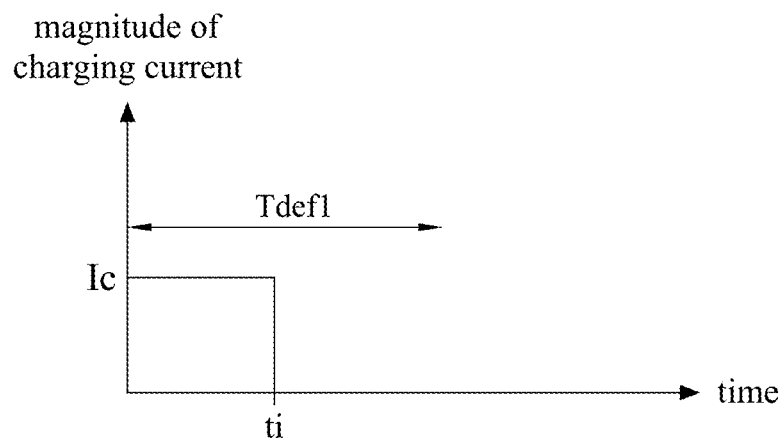
FIG. 4A is a diagram related to charging a semi-finished battery cell with the constant current in the embodiment shown in FIG. 2A of this disclosure.

Please refer to FIG. 4A, which is a diagram related to charging a semi-finished battery cell with the constant current in the embodiment shown in FIG. 2A of this disclosure. In FIG. 4A, the horizontal axis is referred to time and the vertical axis is referred to the current magnitude. A default time period Tdef1 is also marked in FIG. 4A. In the step S105 of the test method for semi-finished battery cell, an overall electric quantity is charged to the semi-finished battery cell with the constant current within the default time period Tdef1 in the embodiment shown in FIG. 4A. In practice, the area under the curve is corresponding to the overall electric quantity consumed for charging the semi-finished battery cell 10 with the constant current. In other words, the overall electric quantity can be obtained according to the current magnitude IC and the time when the default time period Tdef1 is set as being no less than the mentioned constant current charging time period CCI. In practice, the overall electric quantity can be obtained by performing integration calculation according to the current and the time. In another way, an overall time in which the semi-finished battery cell 10 is charged with the constant current is measured at first and then said overall electric quantity is obtained according to a magnitude of the charge current and the overall time when the magnitude of the charge current is already known.

Figure 4B:
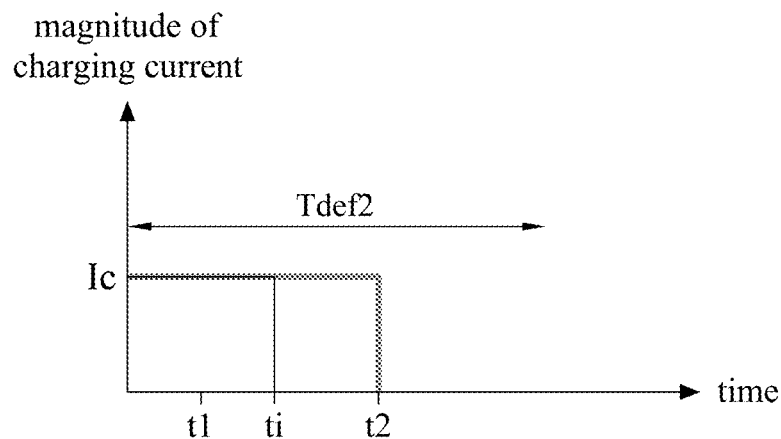
FIG. 4B is a diagram related to charging a semi-finished battery cell with the constant current in the embodiment shown in FIG. 2B of this disclosure.

Please refer to FIG. 4B, a diagram related to charging a semi-finished battery cell with the constant current in the embodiment shown in FIG. 2B of this disclosure. Similar to FIG. 2B, the curve shown by a thin line represents the ideal situation and the curve shown by a bold line represents the non-ideal situation. Besides, a default time period Tdef2 is marked in FIG. 4B. The semi-finished battery cell 10' abnormally discharges at time instant t1 which is prior to the time instant ti so the constant current charging time period CC1 is longer than the constant current charging time period CCI. Therefore, the area under the bold line will be larger than the area under the thin line, which means that the overall electric quantity consumed for charging with the constant current in the non-ideal situation is larger than that in the ideal situation. Therefore, as shown in the step S107 and step S109 in the test method for the semi-finished battery cell, a comparison between the overall electric quantity and an electric quantity threshold is made when a current overall electric quantity consumed for charging with the constant current is obtained. It is implied that the overall electric quantity is larger than the electric quantity consumed for charging the semi-finished battery cell with the constant current when the overall electric quantity is larger than the electric quantity threshold. At the moment, an insulation between one of the first electrodes and one of the second electrodes of the semi-finished battery cell is determined as poor.

In one embodiment, the default time period Tdef2 covers a part of the time period in which the semi-finished battery cell is charged with the constant voltage. That is, in the embodiment shown in FIG. 4B, measuring the overall electric quantity charged to the semi-finished battery cell with the constant current is performed later than the switching to constant voltage charging from constant current charging for a certain period of time. In another embodiment, a related circuit for measuring the overall electric quantity charged to the semi-finished battery cell is triggered to start the measurement upon the switching to constant voltage charging from constant current charging.

Please refer to FIG. 4C. FIG. 4C is a diagram related to the overall charging quantity charged a semi-finished battery cell with the constant current in the embodiment of FIG. 2C of this disclosure. As shown in FIG. 4C, the plurality of areas under the curve can be defined as an area a1 and an area a2 respectively. The sum of the area a1 and the area a2 is the overall electric quantity charged to the semi-finished battery cell 10' with the constant current. In one embodiment, the overall electric quantity consumed for charging with the constant current before the time instant t4 can be calculated for related determination at the time instant t4. In another aspect, said measurement is equivalent to measurement of the overall electric quantity consumed for charging with the constant current in the default time period Tdef3. In another embodiment, a measurement and a determination can be made at every time that the charging is switched to said constant voltage charging from said constant current charging. In view of FIG. 4C, the area a1 and area a2 can be obtained respectively at first and then the sum can be obtained thereby. Subsequently, it is determined whether the sum is larger than the electric quantity threshold. In another way, the area a1 and area a2 can be obtained respectively at first and then the area a1 and area a2 are compared to corresponding thresholds respectively, wherein the threshold corresponding to the area a1 is, for example, the mentioned electric quantity threshold, and the another threshold corresponding to the area a2 can be zero or a value close to zero. In another aspect, the above procedures are equivalent to steps of obtaining the electric quantity consumed for charging with the constant current in the default time period Tdef3' and the electric quantity consumed for charging with the constant current in the default time period Tdef3", and obtaining said overall electric quantity in accordance for performing determination.

Based on the embodiment in FIG. 4C, an embodiment of the test method for semi-finished battery cell in this disclosure can further comprises the following steps. Please refer to FIG. 5, a flow chart of a part of a test method for a semi-finished battery cell in another embodiment of this disclosure. In the embodiment of FIG. 5, the following steps are performed: the step S201, measuring a plurality of current charging time periods in which the semi-finished battery cell is charged with the constant current; the step S203, obtaining a plurality of current charging electric quantities according to the constant current and the plurality of current charging time periods; and the step S205, determining whether each of the current charging electric quantities is larger than a respective one of a plurality of electric quantity thresholds, wherein an insulation between the first electrode and the second electrode of the semi-finished battery cell is determined as poor when one of the current electric charging quantities is larger than the corresponding electric quantity threshold.

As mentioned previously, in the test method provided by this disclosure, a determination of the insulation between the first electrodes and the second electrodes of the semi-finished battery cell is performed based on whether the overall electric quantity is larger than the electric quantity threshold QREF. In one embodiment, said electric quantity threshold QREF may be a theoretically ideal charging quantity plus a tolerance value. The ideal charging quantity can be obtained based on theoretical calculations, process parameters or experience or may be obtained according to the overall electric quantity that said voltage difference required to reach the voltage threshold VTH with the constant current charging. The tolerance value can be defined by person having ordinary skill in the art according to his needs and is not limited herein.

Figure 6:
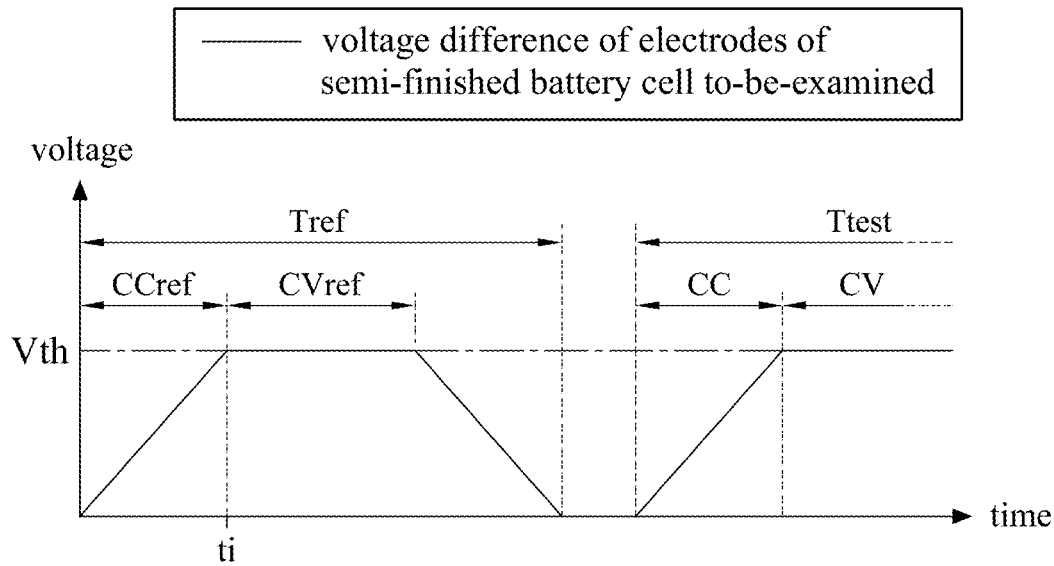
FIG. 6 is a voltage difference diagram related to charging a semi-finished battery cell in another embodiment of this disclosure.

In another embodiment, said electric quantity threshold QREF is obtained by adding up an experiment charge electric quantity and a tolerance value, wherein the experiment charge electric quantity is chosen from one of several consumed electric quantities acquired by charging the semi-finished battery cell for several times. Please refer to FIG. 6, a voltage difference diagram related to charging a semi-finished battery cell in another embodiment of this disclosure. A reference time period Tref and a practical testing time period Ttest are depicted in FIG. 6. The details of the reference time period Tref is similar to the aforementioned embodiment and is not repeated. Similar charging procedures are performed in the reference time period Tref. Specifically, a constant current charging time period CCref and a constant voltage charging time period CVref are defined in the reference time period Tref. The semi-finished battery cell is charged with the constant current in the constant current charging time period CCref of the reference time period Tref until the voltage difference of the electrodes of the semi-finished battery cell is not less than said voltage threshold VTH. In the constant voltage charging time period CVref, the semi-finished battery cell is charged with the constant voltage, wherein the overall electric quantity consumed for charging with the constant current in the reference time period Tref is served as a reference overall electric quantity. The reference overall electric quantity plus the tolerance value forms said electric quantity threshold QREF.

Figure 7:
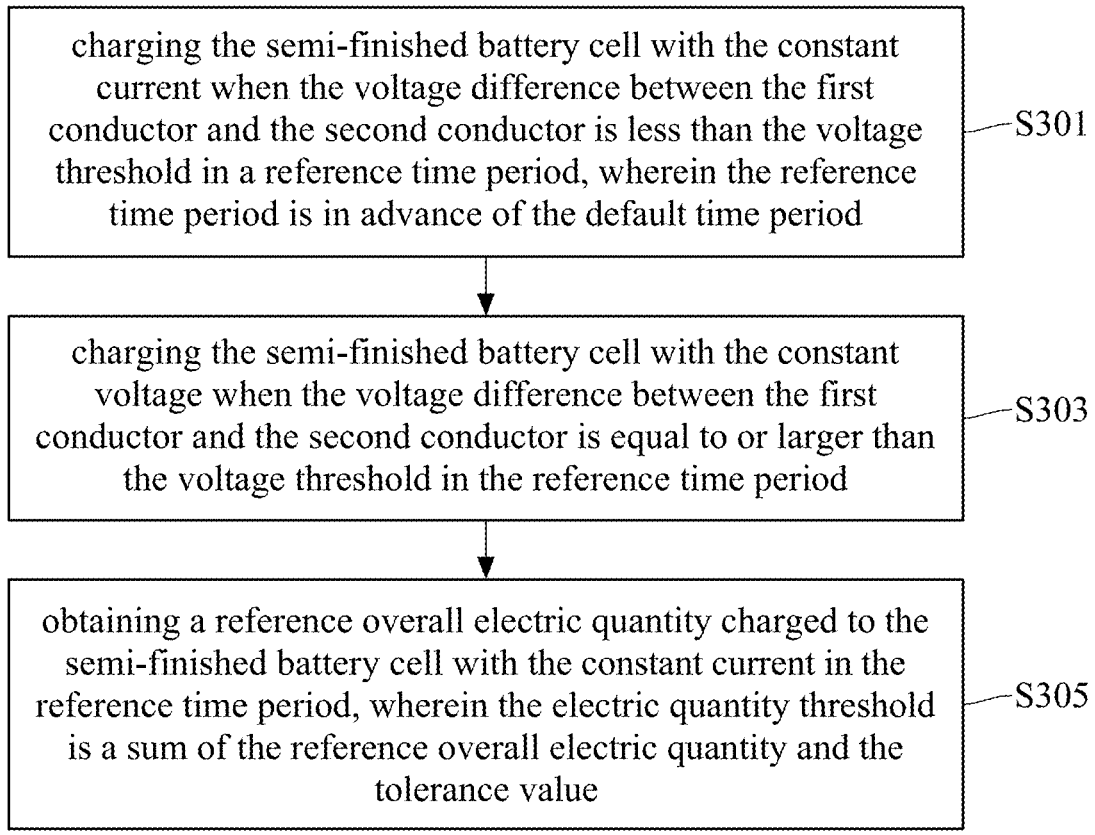
FIG. 7 is a flow chart of a part of a test method for a semi-finished battery cell in further another embodiment of this disclosure.

Corresponding to the embodiment in FIG. 6, the test method for semi-finished battery cell in another embodiment further comprises the following steps to generate the electric quantity threshold QREF. Please refer to FIG. 7, a flow chart of a part of a test method for a semi-finished battery cell in further another embodiment of this disclosure. In FIG. 7, the following steps are performed: in the step S301, charging the semi-finished battery cell with the constant current when the voltage difference between the first conductor and the second conductor is less than the voltage threshold in a reference time period, wherein the reference time period is in advance of the default time period; in the step S303, charging the semi-finished battery cell with the constant voltage when the voltage difference between the first conductor and the second conductor is equal to or larger than the voltage threshold in the reference time period; and in the step S305, obtaining a reference overall electric quantity charged to the semi-finished battery cell with the constant current in the reference time period, wherein the electric quantity threshold is a sum of the reference overall electric quantity and the tolerance value.

In view of the above, this disclosure provides a method for testing a semi-finished battery cell. Whether the overall electric quantity charged to the semi-finished battery cell with the constant current is larger than the electric quantity threshold is determined to further evaluate whether the internal insulation of the semi-finished battery cell is qualified or not. As a result, the testing time is reduced and a plurality of tests can be made to compare different condition for individual machine. Moreover, in contrary to the traditional qualitative analysis recognizing the existence of short circuit, the test method provided in this disclosure can serve as a quantitative analysis according to the charge quantity and is much practical.

What is claimed is:

1. A method for testing a semi-finished battery cell, the semi-finished battery cell including a first electrode and a second electrode, with said first and second electrodes disposed in a pile, with an insulation layer disposed between the first electrode and the second electrode, with the first electrode electrically connected to a first conductor, and with the second electrode electrically connected to a second conductor, the method comprising:
    charging the semi-finished battery cell with a constant current when a voltage difference between the first conductor and the second conductor is less than a voltage threshold;
    charging the semi-finished battery cell with a constant voltage when the voltage difference between the first conductor and the second conductor is equal to or larger than the voltage threshold;
    obtaining an overall electric quantity after a default time period, wherein the overall electric quantity is an electric quantity charged to the semi-finished battery cell with the constant current during the default time period; and
    determining whether the overall electric quantity is larger than an electric quantity threshold, wherein an insulation between the first electrode and the second electrode of the semi-finished battery cell is determined as poor when the overall electric quantity is larger than the electric quantity threshold.

2. The method according to claim 1, wherein the default time period covers a part of a time period when the semi-finished battery cell is charged with the constant voltage.

3. The method according to claim 2, further comprising:
    measuring an overall time in which the semi-finished battery cell is charged with the constant current, and obtaining the overall electric quantity according to the constant current and the overall time.

4. The method according to claim 2, further comprising:
    measuring a plurality of current charging time periods in which the semi-finished battery cell is charged with the constant current;
    obtaining a plurality of current charging electric quantities according to the constant current and the plurality of current charging time periods; and
    determining whether each of the current charging electric quantities is larger than a respective one of a plurality of electric quantity thresholds, wherein an insulation between the first electrode and the second electrode of the semi-finished battery cell is determined as poor when one of the current electric charging quantities is larger than the corresponding electric quantity threshold.

5. The method according to claim 1, further comprising:
    calculating the overall electric quantity charged to the semi-finished battery cell with the constant current after beginning charging the semi-finished battery cell with the constant voltage.

6. The method according to claim 5, further comprising:
    measuring an overall time in which the semi-finished battery cell is charged with the constant current before charging the semi-finished battery cell with the constant voltage, and performing an integration calculation according to the constant current and the overall time to obtain the overall electric quantity.

7. The method according to claim 1, wherein the electric quantity threshold is a sum of an ideal charging quantity corresponding to the semi-finished battery cell and a tolerance value.

8. The method according to claim 1, further comprising:
    charging the semi-finished battery cell with the constant current when the voltage difference between the first conductor and the second conductor is less than the voltage threshold in a reference time period, wherein the reference time period is in advance of the default time period;
    charging the semi-finished battery cell with the constant voltage when the voltage difference between the first conductor and the second conductor is equal to or larger than the voltage threshold in the reference time period; and
    obtaining a reference overall electric quantity charged to the semi-finished battery cell with the constant current in the reference time period, wherein the electric quantity threshold is a sum of the reference overall electric quantity and a tolerance value.

* * * * *